US006577379B1

(12) United States Patent
Boettiger et al.

(10) Patent No.: US 6,577,379 B1
(45) Date of Patent: Jun. 10, 2003

(54) METHOD AND APPARATUS FOR SHAPING AND/OR ORIENTING RADIATION IRRADIATING A MICROLITHOGRAPHIC SUBSTRATE

(75) Inventors: Ulrich C. Boettiger, Boise, ID (US); Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/993,053

(22) Filed: Nov. 5, 2001

(51) Int. Cl.[7] .............................................. G03B 27/68
(52) U.S. Cl. ....................................................... 355/52
(58) Field of Search .............................. 355/51, 52, 53, 355/60, 66

(56) References Cited

U.S. PATENT DOCUMENTS

| | | | |
|---|---|---|---|
| 4,988,188 A | | 1/1991 | Ohta |
| 5,142,132 A | | 8/1992 | MacDonald et al. |
| 5,194,893 A | * | 3/1993 | Nishi ........................... 355/53 |
| 5,300,971 A | * | 4/1994 | Kudo ........................... 355/53 |
| 5,436,464 A | | 7/1995 | Hayano et al. |
| 5,602,620 A | | 2/1997 | Miyazaki et al. |
| 5,684,566 A | * | 11/1997 | Stanton ........................ 355/67 |
| 5,907,392 A | | 5/1999 | Makinouchi |
| 5,969,800 A | | 10/1999 | Makinouchi |
| 6,084,244 A | | 7/2000 | Saiki et al. |
| 6,188,464 B1 | | 2/2001 | Makinouchi |
| 6,285,440 B1 | * | 9/2001 | Takahashi .................... 355/67 |
| 6,392,740 B1 | * | 5/2002 | Shiraishi et al. .............. 355/53 |

FOREIGN PATENT DOCUMENTS

JP          11231234          8/1999

OTHER PUBLICATIONS

U.S. patent application Ser. No. 09/945,167, Boettiger et al., filed Aug. 30, 2001.
U.S. patent application Ser. No. 09/945,316, Boettiger et al., filed Aug. 30, 2001.
Fukuda, H. et al., "Improvement of defocus tolerance in a half–micron optical lithography by the focus latitude enhancement exposure method: Simulation and experiment," J. Vac. Sci. Technol B. vol. 7 No. 4, Jul./Aug. 1989, pp. 667–674, 8 pages.
Texas Instruments Incorporated, "What the Industry Experts Say About Texas Instruments Digital MicroMirror Display (DMD) Technology," 6/94, (2 pages).
Optics. ORG, Industry News, "Micronic and Fraunhofer Develop New Pattern Generators," Posted: Dec. 10, 1999 (1 page).

* cited by examiner

Primary Examiner—Russell Adams
Assistant Examiner—D. Ben Esplin
(74) Attorney, Agent, or Firm—Perkins Coie LLP

(57) ABSTRACT

A method and apparatus for shaping and/or orienting radiation irradiating a microlithographic substrate. The method can include directing a beam of radiation along a radiation path toward a reflective medium, with the beam having a first shape in a plane generally transverse to the radiation path. The shape of the radiation beam can be changed from the first shape to a second, different shape by inclining a first portion of the reflective medium relative to a second portion of the reflective medium and reflecting the radiation beam toward a microlithographic substrate. The beam can then impinge on the microlithographic substrate after changing the shape from the first shape to the second shape, and at least a portion of the radiation can be inclined relative to the radiation path, for example, to enhance the imaging of selected diffractive orders.

71 Claims, 6 Drawing Sheets

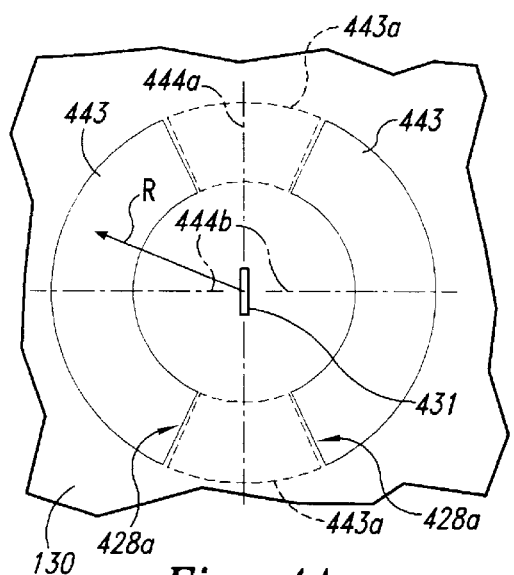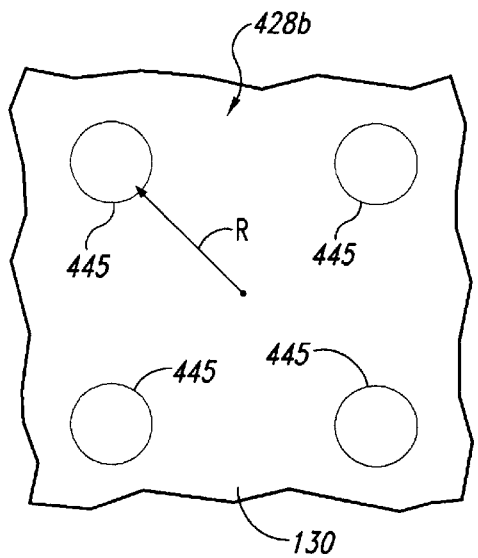
Fig. 4A  Fig. 4B
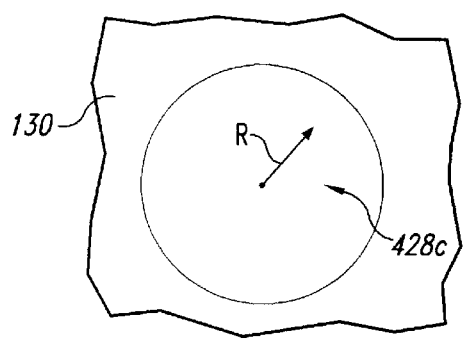
Fig. 4C
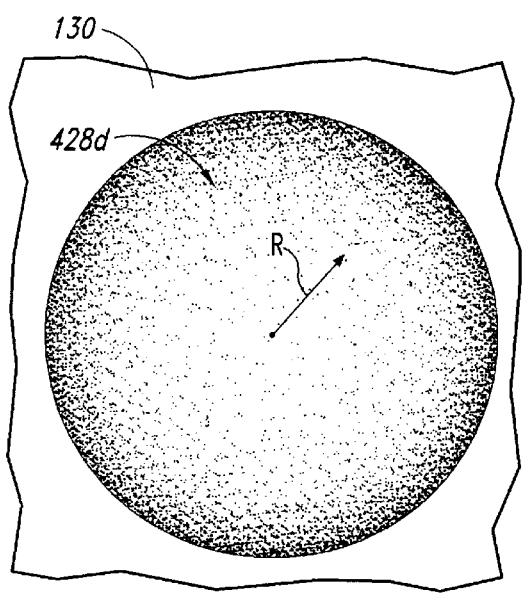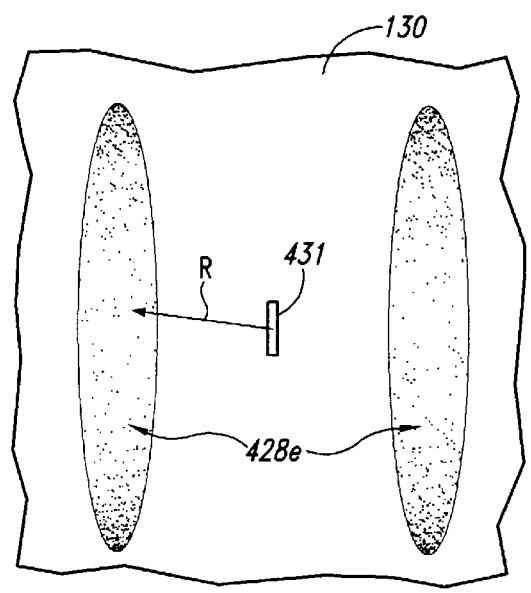
Fig. 4D  Fig. 4E

METHOD AND APPARATUS FOR SHAPING AND/OR ORIENTING RADIATION IRRADIATING A MICROLITHOGRAPHIC SUBSTRATE

CROSS-REFERENCE TO RELATED APPLICATIONS

This application relates to material disclosed in U.S. application Ser. No. 09/945,167 titled "Method and Apparatus for Irradiating a Microlithographic Substrate" and filed on Aug. 30, 2001; and U.S. application Ser. No. 09/945,316 titled "Method and Apparatus for Controlling Radiation Beam Intensity Directed to Microlithographic Substrates" and filed on Aug. 30, 2001; both incorporated herein in their entireties by reference.

BACKGROUND

The present invention is directed toward methods and apparatuses for shaping and/or orienting radiation directed toward a microlithographic substrate. Microelectronic features are typically formed in microelectronic substrates (such as semiconductor wafers) by selectively removing material from the wafer and filling in the resulting openings with insulative, semiconductive, or conductive materials. One typical process includes depositing a layer of radiation-sensitive photoresist material on the wafer, then positioning a patterned mask or reticle over the photoresist layer, and then exposing the masked photoresist layer to a selected radiation. The wafer is then exposed to a developer, such as an aqueous base or a solvent. In one case, the photoresist layer is initially generally soluble in the developer, and the portions of the photoresist layer exposed to the radiation through patterned openings in the mask change from being generally soluble to become generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to expose the wafer material below.

The wafer is then subjected to etching or ion implantation processes. In an etching process, the etchant removes exposed material, but not material protected beneath the remaining portions of the photoresist layer. Accordingly, the etchant creates a pattern of openings (such as grooves, channels, or holes) in the wafer material or in materials deposited on the wafer. These openings can be filled with insulative, conductive, or semiconductive materials to build layers of microelectronic features on the wafer. The wafer is then singulated to form individual chips, which can be incorporated into a wide variety of electronic products, such as computers and other consumer or industrial electronic devices.

When the photoresist layer is exposed to radiation, the radiation passing through the apertures of the mask or reticle diffracts to form a diffraction pattern that is collected by an optic system and projected onto the photoresist layer. The imaged or projected diffraction pattern defines the features formed in the photoresist layer. Accordingly, the radiation can form a central or zeroth diffraction order, a first diffraction order positioned outwardly on each side of the zeroth order, and possibly second or higher diffraction orders disposed outwardly from the first orders. The smaller the aperture in the reticle, the greater the angle between the zeroth diffraction order and the first diffraction order. If the aperture is reduced in size (for example, to reduce the size of the features in the wafer), the first diffraction order may spread out so far from the zeroth order that it is no longer captured by the optic system and projected onto the photoresist layer. This can adversely affect the quality of image formed on the photoresist layer because the first diffraction order is generally required to adequately define the image projected onto the photoresist layer.

One approach to addressing the foregoing problem is to direct the radiation beam incident on the reticle aperture at an angle relative to the optical axis using a series of optical elements positioned between the radiation source and the reticle. For example, the optical elements (optionally in conjunction with a blade) can form a radiation beam that initially has an annular cross-sectional shape and is directed generally parallel to the optical axis. The radiation beam then passes through a series of optical elements that direct the radiation at an angle to the optical axis. Accordingly, the radiation incident on the reticle aperture will pass through the aperture at an angle. This can effectively tilt the diffraction pattern. As a result, this method can improve the likelihood for capturing one of the first diffraction orders, possibly at the expense of the other.

One drawback with the foregoing approach is that the lenses that shape the radiation beam can have aberrations that adversely affect the quality of the images they produce. One general approach to correcting lens aberrations in wafer optic systems (disclosed in U.S. Pat. No. 5,142,132 to McDonald et al.), is to reflect the radiation beam from a deformable mirror, which can be adjusted to correct for the aberrations in the lens optics.

However, another drawback with the beam-shaping lens system is that it is relatively inflexible. Accordingly, it is difficult to adequately tailor the beam shape (and therefore the resulting incidence angle of the radiation) to different reticle apertures or aperture patterns because the number of available beam shapes for a given optics system may be limited, and it may be time consuming to change one optics system or system set-up for another.

SUMMARY

The present invention is directed to methods and apparatuses for shaping radiation directed to a microlithographic substrate. In one aspect of the invention, the method can include directing a beam of radiation along a radiation path toward a reflective medium, with the beam having a first shape in a plane generally transverse to the radiation path. The method can further include changing a shape of the radiation beam from the first shape to a second shape different than the first shape by inclining a first portion of the reflective medium relative to a second portion of the reflective medium, and reflecting the beam from the reflective medium toward a microlithographic substrate. The method can still further include impinging the beam on the microlithographic substrate after changing the shape from the first shape to the second shape.

In a further aspect of the invention, the radiation beam can have a first intensity prior to impinging on the reflective medium and the method can further include directing the radiation beam away from the reflective medium with the second shape and with a second intensity at least approximately the same as the first intensity. The method can still further include changing an angle of at least a portion of the radiation relative to the radiation path by impinging the radiation beam on an optical element after changing the shape of the beam from the first shape to the second shape.

The invention is also directed toward an apparatus for irradiating a radiation-sensitive surface of a microlithographic substrate. The apparatus can include a support member configured to releasably support the microlithographic substrate, and a radiation source configured to emit a beam of radiation along a radiation path directed toward the support member. A reticle is positioned along the radiation path and is configured to pass the radiation toward the substrate support. A reflective medium is also positioned along the radiation path and has a first portion and a second portion with the first portion movable relative to the second portion to change a shape of the radiation beam in a plane generally transverse to the radiation path from a first shape to a second shape different than the first shape. An optical element can be positioned between the reflective medium and the support member to receive radiation from the reflective medium and direct at least some of the radiation at an angle relative to the radiation path. A controller can be operatively coupled to the reflective medium and can be configured to direct the first portion of the reflective medium to move relative to the second portion to change the shape of the radiation beam from the first shape to the second shape.

BRIEF DESCRIPTION OF THE DRAWINGS

FIGS. 4A–E schematically illustrate shapes of radiation beams produced in accordance with further embodiments of the invention.

DETAILED DESCRIPTION

The present disclosure describes methods and apparatuses for shaping and/or orienting radiation beams directed toward microlithographic substrates. The term "microlithographic substrate" is used throughout to include substrates upon which and/or in which microelectronic circuits or components, data storage elements or layers, vias or conductive lines, micro-optic features, micromechanical features, and/or microbiological features are or can be fabricated using microlithographic techniques. Many specific details of certain embodiments of the invention are set forth in the following description and in FIGS. 1–5 to provide a thorough understanding of these embodiments. One skilled in the art, however, will understand that the present invention may have additional embodiments, and that the invention may be practiced without several of the details described below.

Figure 1:
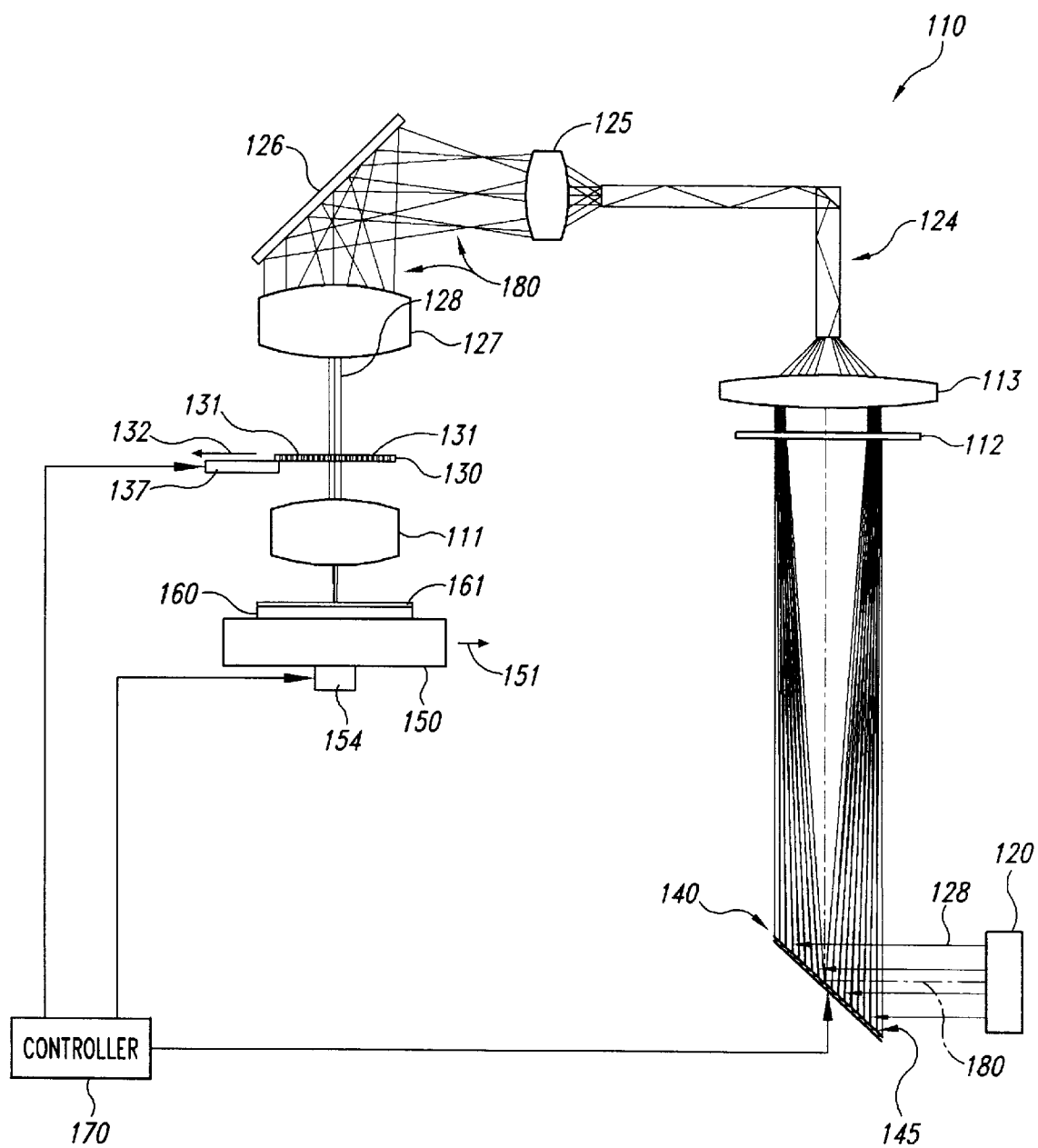
FIG. 1 is an illustration of an apparatus in accordance with an embodiment of the invention with components shown schematically.

FIG. 1 schematically illustrates an apparatus 110 for shaping radiation directed to a microlithographic substrate 160 in accordance with an embodiment of the invention. The apparatus 110 can include an electromagnetic radiation source 120 that directs a radiation beam 128 along a radiation path (or optical axis) 180 toward the microlithographic substrate 160. The radiation beam 128 can be shaped by a reflective medium 140 having a movable reflective surface 145, and can be at least partially diffracted or diffused by a diffractive optical element or diffuser 112. A collecting lens 113 can collect the radiation from the diffuser 112 and direct it at an angle to the radiation path 180. Optionally, the apparatus 110 can further include a light tube 124 positioned to generate a plurality of images of the radiation source 120. The light tube 124 and/or a sizing lens 125 can size the radiation beam 128 which can then be directed by a mirror 126 through a focusing lens 127 to a reticle or mask 130. The radiation beam 128 impinging on the reticle 130 can also be inclined at an angle relative to the radiation path 180, as described in greater detail below with reference to FIGS. 2B–4E.

In one embodiment, the reticle 130 can include reticle apertures 131 through which the radiation beam 128 passes to form an image on the microlithographic substrate 160. Prior to impinging on the microlithographic substrate 160, the radiation beam 128 passes through a reduction lens 111 which reduces the size of the image pattern defined by the reticle 130 to correspond to the size of the features to be formed on the microlithographic substrate 160. The radiation beam 128 can then emerge from the reduction lens 111 to impinge on a radiation-sensitive material (such as a photoresist layer 161) of the microlithographic substrate 160 and form an image on the layer 161.

In one embodiment, the radiation beam 128 can have a width of from about 5 mm. to about 8 mm. and a length (transverse to the plane of FIG. 1) of about 26 mm at the microlithographic substrate 160. In other embodiments, the radiation beam 128 can have other dimensions. The radiation emitted by the source 120 can have a wavelength in the range of about 157 nanometers or less (for example, 13 nanometers) to a value of about 365 nanometers or more. For example, the radiation can have a wavelength of about 193 nanometers. In other embodiments, the radiation can have other wavelengths suitable for exposing the layer 161 on the microlithographic substrate 160.

The microlithographic substrate 160 is supported on a substrate support 150. In one embodiment (a scanner arrangement), the substrate support 150 moves along substrate support path 151, and the reticle 130 moves in the opposite direction along a reticle path 132 to scan the image produced by the reticle 130 across the layer 161 while the position of the radiation beam 128 remains fixed. Accordingly, the substrate support 150 can be coupled to a support actuator 154, and the reticle 130 can be coupled to a reticle actuator 137. As the reticle 130 moves opposite the substrate support 150 and the microlithographic substrate 160, the radiation source 120 can flash to irradiate successive portions of the microlithographic substrate 160 with corresponding successive images produced by the reticle 130, until an entire field of the microlithographic substrate 160 is scanned. In one embodiment, the radiation source 120 can flash at a rate of about 20 cycles during the time required for the microlithographic substrate 160 to move by one beam width (e.g., from about 5 mm. to about 8 mm.). In other embodiments, the radiation source 120 can flash at other rates. In any of these embodiments, the radiation source 120 can flash at the same rate throughout the scanning process (assuming the reticle 130 and the substrate support 150 each move at a constant rate) to uniformly irradiate each field of the microlithographic substrate 160. Alternatively, the radiation source 120 can deliver a continuous radiation beam 128. In any of these embodiments, each field can include one or more dice or chips, or alternatively, each field can include other features.

In another embodiment (a stepper arrangement), the radiation beam 128 and the reticle 130 can expose an entire field of the microlithographic substrate 160 in one or more flashes, while the reticle 130 and the substrate support 150 remain in a fixed transverse position relative to the radiation path 180. After the field has been exposed, the reticle 130 and/or the substrate support 150 can move transverse to the radiation path 180 to expose another field. This process can be repeated until each field of the microlithographic substrate 160 is exposed. In one embodiment, each field can include a single microelectronic chip or die, and in another embodiment, each field can include more than one die.

In a further aspect of the foregoing embodiments, a controller 170 is operatively coupled to the reticle 130 (or the reticle actuator 137) and the substrate support 150 (or the support actuator 154). Accordingly, the controller 170 can control and coordinate the relative movement between these elements. The controller 170 can also be operatively coupled to the reflective medium 140 to control the shape of the radiation beam 128, as described in greater detail below.

Figure 2A:
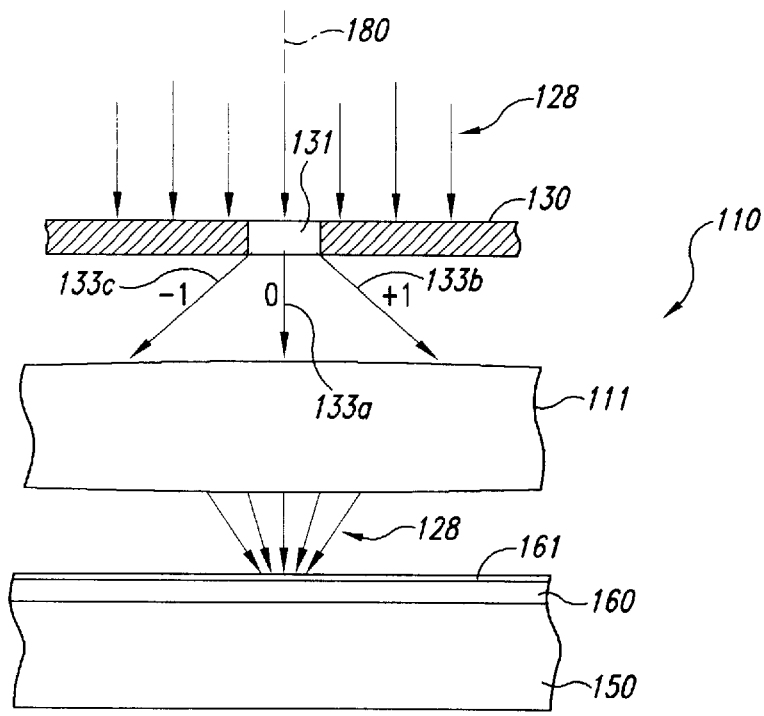
FIG. 2A is a schematic illustration of a portion of the apparatus shown in FIG. 1 with a radiation beam incident on a reticle at a normal angle in accordance with an embodiment of the invention.

FIG. 2A schematically illustrates a portion of the apparatus 110 with the radiation beam 128 impinging on the reticle aperture 131 in a direction generally aligned with the radiation path 180 and generally normal to the plane of the reticle 130. Accordingly, the radiation can produce a zeroth diffraction order 133a generally aligned with the radiation path 180, and first diffraction orders 133b and 133c spaced outwardly from the zeroth diffraction order 133a. This arrangement can be suitable for larger apertures 131, or isolated apertures 131, both of which tend not to have the first diffraction orders 133b and 133c spread out substantially from the zeroth diffraction order 133a. If the first diffraction orders 133b and 133a are spread out significantly from the zeroth order pattern 133a, they may not be captured by the reduction lens 111, and may not impinge on the layer 161.

Figure 2B:
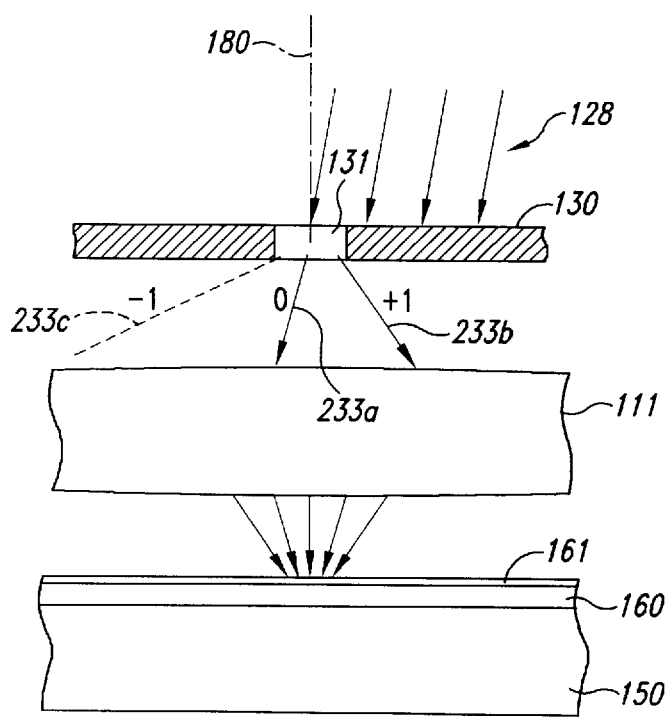
FIG. 2B is a schematic illustration of a portion of the apparatus shown in FIG. 1 with a radiation beam incident on a reticle at an oblique angle in accordance with another embodiment of the invention.

FIG. 2B schematically illustrates a portion of the apparatus 110 shown in FIG. 1 in which at least a portion of the radiation beam 128 is inclined relative to the radiation path 180. Accordingly, this portion of the radiation beam 128 strikes the reticle 130 at a non-normal (i.e., oblique) angle to impart an angular shift to zeroth and first diffraction orders 233a–c. As a result, the zeroth diffraction order 233a is inclined relative to the radiation path 180, unlike the zeroth diffraction order 133b described above with reference to FIG. 2A. The right-most first diffraction order 233b is inclined relative to the radiation path 180 at a shallower angle than the corresponding first diffraction order 133b described above with reference to FIG. 2A. The left-most first diffraction order 233c is inclined at a greater angle than the corresponding first diffraction order 133c described above with reference to FIG. 2A. Accordingly, the left-most first diffraction order 233c may not be captured by the reduction lens 111. However, both the zeroth diffraction order 233a and the right-most first diffraction order 233b can be captured by the reduction lens 111. Accordingly, this arrangement can be suitable for non-isolated apertures 131 or smaller apertures 131, both of which tend to have first diffraction orders spread apart substantially from the zeroth diffraction order, and for which neither first diffraction order may be captured by the reduction lens 111 if the radiation were to strike the reticle 130 at a normal angle as shown in FIG. 2A.

Figure 3A:
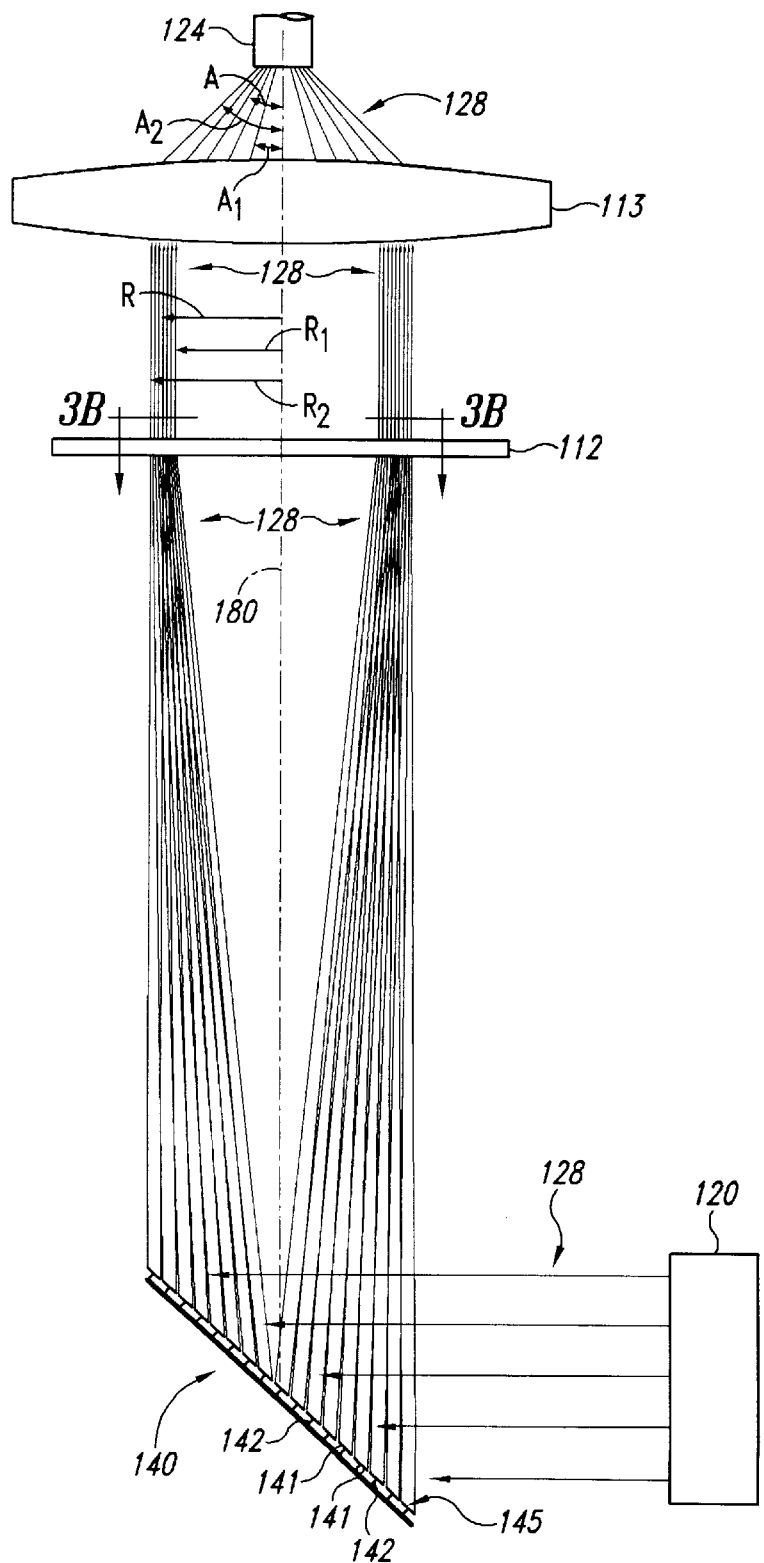
FIG. 3A is a schematic illustration of a portion of the apparatus shown in FIG. 1 in accordance with an embodiment of the invention.
Figure 3B:
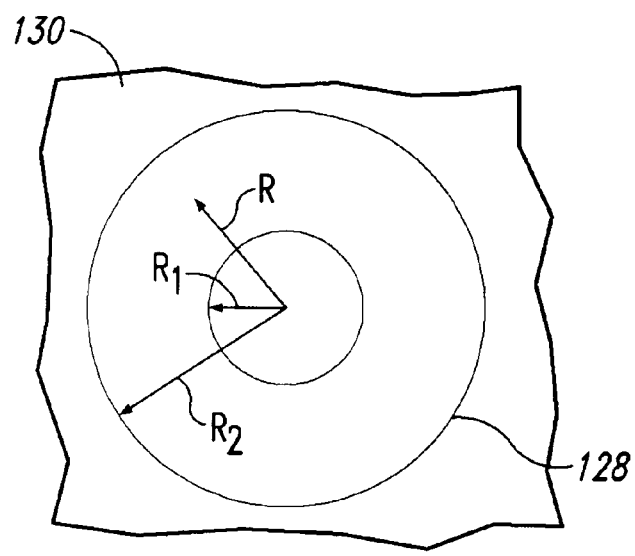
FIGS. 3B–C schematically illustrate radiation beams having distributions of radiation angles produced by an embodiment of the apparatus shown in FIG. 3A.
Figure 3C:
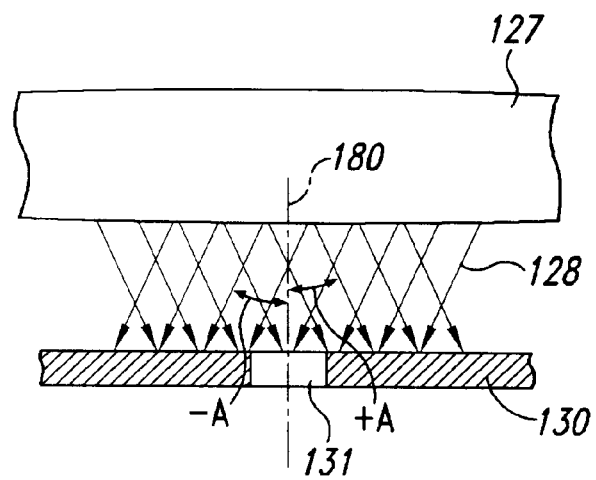

FIGS. 3A–C schematically illustrate how an embodiment of the apparatus 110 shown in FIG. 1 can produce radiation that is inclined relative to the reticle 130 and the radiation path 180 in the manner described above with reference to FIG. 2B. FIG. 3A schematically illustrates a sectional view through the reflective medium 140, the diffuser 112, and the collecting lens 113 described above with reference to FIG. 1 in accordance with an embodiment of the invention. In one aspect of this embodiment, the reflective medium 140 can include a two-dimensional array of reflective elements 141, each coupled to an actuator 142 and defining the reflective surface 145. Reflective (or optionally non-reflective) material can be positioned in the interstices between adjacent reflective elements 141. Alternatively, the reflective medium 140 can include a continuous deformable reflective surface coupled to the actuators 142. In either embodiment, the actuators 142 can be coupled to the controller 170, which can direct each actuator 142 to tilt its corresponding reflective element 141 (or portion of the reflective surface 145) to a selected angle relative to incident radiation arriving from the radiation source 120. Accordingly, the reflective medium 140 can alter the path of the incoming radiation to form any arbitrary shape at the diffuser 112. In one aspect of this embodiment, the reflective medium 140 can be positioned far enough away from the diffuser 112 so that radiation arriving at the diffuser 112 can be generally parallel to the radiation path 180. The diffuser 112 can then diffuse the radiation arriving from the reflective medium 140 to smooth out potential discontinuities in the radiation beam 128. The collecting lens 113 can collect the radiation from the diffuser 112 and incline the radiation at an angle A relative to the radiation path 180, as described in greater detail below.

In one aspect of this embodiment, the shape of the radiation beam 128 incident upon and exiting the diffuser 112 can be generally annular, with a radius R varying from an inner radius $R_1$ to an outer radius $R_2$ and with the radiation aligned generally parallel with the radiation path 180. The collecting lens 113 can collect the radiation from the diffuser 112 and direct it toward the light tube 124 (or another optical element) with the radiation converging toward the radiation path 180 at an angle A that varies from an inner angle $A_1$ to an outer angle $A_2$. As the radius R increases, angle A also increases. Accordingly, radiation toward the periphery of the annulus has a higher inclination angle A than radiation toward the center of the annulus. If the annulus defines a relatively narrow band (i.e., if the distance between $R_1$ and $R_2$ is relatively small), the angular orientation of the radiation will tend to be concentrated in a narrow range of angles A. If the annulus defines a relatively broad band (i.e., if the distance between $R_1$ and $R_2$ is relatively large), the angular orientation of the radiation will tend to be distributed over a wider range of angles A. In either embodiment, the optics system between the collecting lens 113 and the reticle 130 can either further alter the distribution of the radiation inclination angles A across the radiation beam 128, or maintain approximately the same distribution.

FIG. 3B is a cross-sectional view of the radiation beam 128 taken substantially along line 3B—3B of FIG. 3A illustrating the annular shape of the radiation beam 128 in accordance with an embodiment of the invention. FIG. 3C schematically illustrates in side view the radiation beam 128 as it strikes the reticle 130 proximate to the reticle aperture 131 For purposes of illustration, the radiation beam 128 is shown in FIG. 3C as including some beamlets inclined at an angle +A relative to the radiation path 180, and some beamlets inclined at an angle −A relative to the radiation path 180. In actuality, the beam 128 can include beamlets describing a distribution of inclination angles that depends upon the shape and size of the beam impinging on the collecting lens 113, as described above with reference to FIG. 3A. Because the beamlets are inclined relative to the radiation path 180, they can emphasize selected diffraction orders at the expense of others, generally as described above with reference to FIG. 2B. For example, the beamlets oriented at angle +A can emphasize the +1 diffraction order at the expense of the −1 diffraction order, and the beamlets oriented at angle −A can emphasize the −1 diffraction order at the expense of the +1 diffraction order. In other embodiments, the orientation of the radiation in the beam 128 can be selected to emphasize other diffraction orders, and/or can have other shapes or arrangements, as described in greater detail below with reference to FIGS. 4A–4E.

FIGS. 4A–4E illustrate cross-sectional views of other beam shapes that can be produced by adjusting the relative positions of one or more portions of the reflective medium 140 (FIG. 3A). For example, as shown in FIG. 4A, a beam 428a can have a dipole shape with two arcuate dipoles 443. The dipoles 443 can be aligned along a major axis 444a and transverse to a minor axis 444b. In a further aspect of this embodiment, the major axis 444a can be at least approximately aligned with a corresponding major axis of an elongated reticle aperture 431, shown superimposed on the beam shape of FIG. 4A for purposes of illustration. Accordingly, the shape of the beam produced by the reflective medium 140 can be tailored to the shape of the aperture in the reticle 130, and correspondingly, the shape of the image printed on the microlithographic substrate 160. In a further aspect of this embodiment, at least some of the radiation can be directed into interstitial regions 443a to irradiate other reticle apertures having a major axis generally aligned with the minor axis 444b. The intensity of the radiation directed to the interstitial regions 443a can be less than that directed to the dipoles 443 when the radiation intensity requirements for apertures aligned with the minor axis 444b are less than those for apertures aligned with the major axis 444a.

In other embodiments, the beam can have other shapes. For example, as shown in FIG. 4B, a beam 428b can have a quadrupole shape with four quadrupole regions 445. Each quadrupole region 445 can direct the radiation toward the collecting lens (FIG. 3A), which can then incline the radiation relative to the radiation path 180, in a manner generally similar to that described above. FIG. 4C illustrates a beam 428c having a shape corresponding to that described above with reference to FIG. 2A. Accordingly, the radiation incident on the reticle 130 proximate to the reticle aperture 131 is at least approximately normal.

FIG. 4D illustrates a radiation beam 428d having an intensity distribution altered from that of the beam as it impinges on the reflective medium 140 (FIG. 1). For example, the overall intensity of the radiation beam 428d can be the same as that of the beam as it impinges on the reflective medium 140, but the intensity of the reflected beam can be greater toward the center of the beam 428d than toward the periphery of the beam 428d. This effect can be achieved by adjusting the angular position of the reflective elements 141 (FIG. 3A) to direct more of the incident light to the center of the diffuser 112 and the collecting lens 113 (FIG. 3A) than to the periphery of the diffuser 112 and the collecting lens 113. Accordingly, the intensity of the radiation beam 428d can provide additional control over the illumination of the microlithographic substrate 160. For example, by increasing the intensity of radiation toward the center of the beam 428d, this arrangement can emphasize the effect of radiation that is more closely aligned with radiation path 180 (i.e., has a relatively small angle A), relative to radiation that diverges more significantly from the radiation path 180. FIG. 4E illustrates a radiation beam 428e having a dipole configuration, also with a variation in intensity across the cross-section of the beam. For any of the foregoing embodiments, the radius R of any position in the radiation beam impinging on the diffuser 112 and the collecting lens 113 can correlate with the angle A at which the radiation exiting the collecting lens 113 is oriented relative to the radiation path 180, as described above with reference to FIG. 3A.

One feature of several of the embodiments described above with reference to FIGS. 1–4E is that the reflective medium 140 can change the shape of the radiation beam to any arbitrary configuration. This feature, particularly in combination with the collecting lens 113 (and, optionally, the diffuser 112), can be used to adjust the angle at which the radiation strikes the reticle aperture 131. By controlling the angle at which the radiation impinges on the reticle, the apparatus can control the diffractive orders that ultimately impinge on the microlithographic substrate 160. One advantage of this feature is that the reflective medium 140 can be simpler than the array of lenses that would conventionally be required to form a radiation beam having the same shape. The simpler reflective medium 140 can reduce the cost of producing shaped radiation beams, and can also improve the optical efficiency of the radiation beam because the beam need not pass through as great a number of lenses or other optical elements.

Another advantage of this feature is that the reflective medium 140 can be easily and quickly adjusted to produce an almost infinite variety of radiation beam shapes and corresponding radiation inclination angles. For example, the reflective medium 140 can be adjusted in a fraction of a second. This is unlike some conventional arrangements that require 20 seconds or even substantially longer to adjust. Accordingly, the same reflective medium 140 can remain in the optical system and can be adjusted (for example, with the controller 170) depending on the pattern, size and configuration of the apertures 131 and the reticle 130. This arrangement can simplify the task of changing the beam inclination angle when one reticle having a particular arrangement of reticle apertures 131 is exchanged for another reticle having a different arrangement of reticle apertures. Alternatively, the reflective surface can change the shape of the beam 128 as the reticle 130 and the microlithographic substrate 160 scan relative to each other. For example, the reflective medium 140 can be configured to generate a radiation beam 128 having a first shape while the radiation beam irradiates reticle apertures having a corresponding first shape. When the reticle 130 moves to a position that aligns with the beam 128 with reticle apertures having a second, different shape, the reflective medium 140 can change the shape of the beam accordingly.

Still a further advantage of this feature is that the reflective medium 140 can account for other variations in the characteristics of the process implemented to form images on the microlithographic substrate 160. For example, different reticles 130 configured to have reticle apertures 131 of the same pattern and size may in fact have slightly different reticle apertures 131 due to manufacturing tolerances associated with the production of the reticles themselves. The reflective medium 140 can be adjusted to account for such differences. The reflective medium 140 can also be adjusted to account for differences in other features of the system 110, such as the lenses or other optical features, and/or variations from one microlithographic substrate 160 to the next or one photoresist layer 161 to the next.

Still another advantage of the foregoing feature is that the overall intensity of the radiation beam 128 reflected from the reflective medium 140 can be at least approximately the same as the overall intensity of the radiation beam 128 incident on the reflective medium 140. This is so even if the reflective medium 140 is configured to redistribute the radiation intensity (as described above with reference to FIGS. 4D–E). Accordingly, the foregoing arrangement can form shaped radiation beams without significantly compromising overall intensity, as would occur if a plate having a cut-out with the desired beam shape were interposed between the radiation source 120 and the microlithographic substrate 160. By preserving the incident radiation intensity, the foregoing arrangement can be used to irradiate the microlithographic substrate 160 in the manner described above without decreasing the process throughput by increasing the time required to adequately expose the microlithographic substrate 160 to the radiation.

Another advantage of the foregoing arrangement is that the reflective medium 140 can flexibly control the intensity of the radiation as a function of the angle between the radiation and the radiation path. Accordingly, the arrangement can increase the intensity of a portion of the radiation at a selected inclination angle (or range of radiation angles) when it is desirable to emphasize the characteristics of the image produced by the radiation at that angle (or range of angles). The intensity distribution can be readily changed (by changing the orientation of the reflective elements 141) when it is desirable to emphasize the effects of radiation at a different angle or range of angles.

Yet a further advantage of this arrangement is that the reflective medium 140 can be iteratively adjusted until the radiation beam shape (and therefore the desired distribution of radiation incidence angles at the reticle) is attained. For example, a user can adjust the reflective medium 140 to produce a first beam shape and then evaluate the effect on a microlithographic substrate 160. If the effect is not the desired effect, the configuration of the reflective medium 140 can be further adjusted (without replacing a complex lens system) until the desired effect is achieved.

Figure 5:
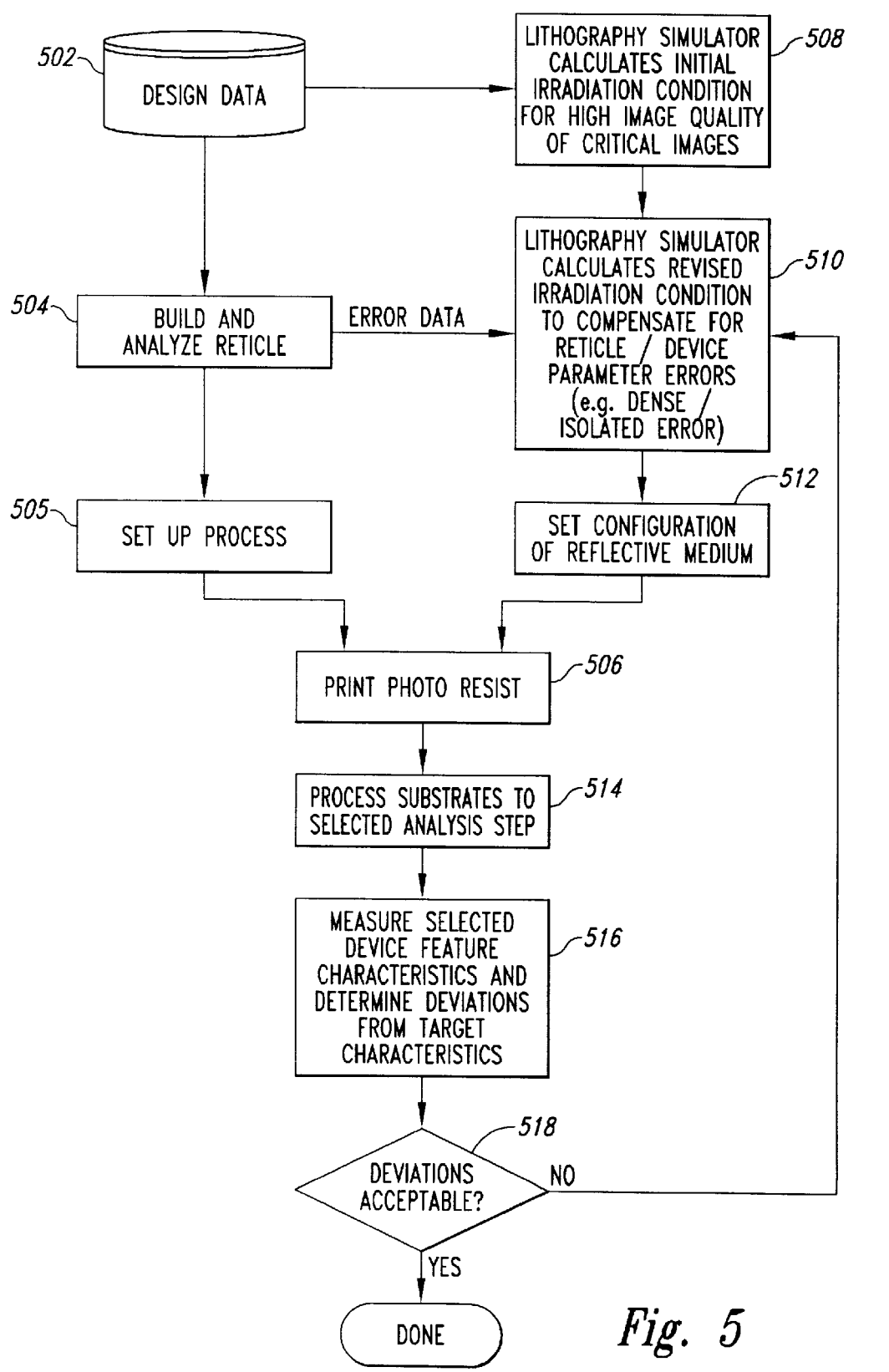
FIG. 5 is a flow diagram illustrating a method for configuring radiation directed to microlithographic substrates in accordance with an embodiment of the invention.

FIG. 5 is a flow chart illustrating an iterative process 500 in accordance with an embodiment of the invention. In one aspect of this embodiment, the process can include compiling design data for a reticle (step 502), building and analyzing a reticle (step 504), and setting up an exposure process (step 505). In parallel, the design data compiled in step 502 can optionally be input into a lithography simulator in step 508 to calculate initial irradiation conditions for high quality critical images of the microlithographic substrate. Suitable lithography simulators are available from KLA Tencor of San Jose, Calif. and Sigma-C of Munich, Germany. In step 510, the process can optionally include revising the illumination conditions to compensate for reticle and/or device parameter errors. Optionally, this step can include using data obtained from the analysis completed in step 504. In one embodiment, the errors can be attributed to a dense concentration of microlithographic features. Alternatively, the errors can be attributed to isolated microlithographic features. In still further embodiments, the errors can be attributed to other features. In any of these embodiments, the process can further include setting the configuration of the reflective medium with the controller in step 512, and then printing an image on a photoresist layer of the microlithographic substrate (step 506) using the reticle configuration established in step 505, along with the reflective medium configuration established in step 512.

In step 514, the microlithographic substrate can be processed to a selected analysis step. In step 516, the process can include measuring selected device feature characteristics and determining deviations (if any) from target characteristics of these features. In step 518, the process can include determining whether the deviations are within acceptable limits. If the deviations are within acceptable limits, the process can end. Alternatively, if the deviations are not within acceptable limits, an error between the measured characteristics and the target characteristics can be calculated and used to modify the configuration of the reflective medium. In one aspect of this embodiment, the lithography simulator can be used to aid in determining the updated reflective medium configuration. This iterative process can be repeated until the measured characteristics deviate from the target characteristics by no more than an acceptable amount.

From the foregoing, it will be appreciated that specific embodiments of the invention have been described herein for purposes of illustration, but that various modifications may be made without deviating from the spirit and scope of the invention. For example, any of the refractive elements described above, including the reticle, can be replaced with reflective elements that perform generally the same function. Accordingly, the invention is not limited except as by the appended claims.

What is claimed is:

1. A method for irradiating a microlithographic substrate, comprising:

directing a beam of radiation along a radiation path toward a reflective medium having a reflective surface, the beam of radiation having a first shape and a first intensity uniformity in a plane generally transverse to the radiation path;

changing a shape of the radiation beam from the first shape to a second shape different than the first shape by inclining a first portion of the reflective surface relative to a second portion of the reflective surface and reflecting the beam from the reflective surface toward a microlithographic substrate, the beam with the second shape having a second intensity uniformity less than the first intensity uniformity; and impinging the beam on the microlithographic substrate after changing the shape from the first shape to the second shape.

2. The method of claim 1, further comprising changing an angle of at least a portion of the radiation relative to the radiation path by passing the radiation beam through an optical element after changing the shape of the beam from the first shape to the second shape.

3. The method of claim 1 wherein the radiation beam has a first intensity prior to impinging on the reflective surface, and wherein the method further comprises:

directing the radiation beam away from the reflective surface with the second shape and with a second intensity at least approximately the same as the first intensity; and changing an angle of at least a portion of the radiation relative to the radiation path by impinging the radiation beam on an optical element after changing the shape of the beam from the first shape to the second shape.

4. The method of claim 1 wherein the first portion of the reflective surface forms a smooth, continuous surface with the second portion of the reflective surface, and wherein moving the first portion of the reflective surface includes moving one portion of the continuous surface relative to another.

5. The method of claim 1, further comprising selecting the radiation to have a wavelength of from about 13 nanometers or less to about 365 nanometers.

6. The method of claim 1 wherein the first portion of the reflective surface includes a first reflective element and the second portion of the reflective surface includes a second reflective element, and wherein moving the first portion includes moving the first element relative to and independently of the second element.

7. The method of claim 1, further comprising scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

8. The method of claim 1, further comprising stepping the microlithographic substrate and the reticle relative to each other by impinging the radiation on a first field of the microlithographic substrate while the microlithographic substrate is in a fixed transverse alignment with the reticle, moving at least one of the reticle and the microlithographic substrate transversely relative to the other to align a second field with the reticle, and exposing the second field to the radiation.

9. The method of claim 1 further comprising exposing a radiation-sensitive material of the microlithographic substrate to the radiation beam.

10. The method of claim 1, further comprising exposing a layer of photoresist material on the microlithographic substrate to the radiation beam.

11. The method of claim 1, further comprising:
directing the radiation with the second shape along the radiation path toward the microlithographic substrate;
ceasing to impinge the radiation on the microlithographic substrate while changing a position of the first portion of the reflective surface relative to the second portion; and
directing radiation with a third shape different than the second shape from the reflective surface and toward the microlithographic substrate.

12. The method of claim 1, further comprising changing the shape of the radiation beam from the second shape to a third shape different than the second shape while the radiation beam impinges on the microlithographic substrate by moving at least one of the first and second portions of the reflective surface relative to the other.

13. The method of claim 1 wherein changing a shape of the radiation beam from a first shape to a second shape different than the first shape includes changing the shape to at least one of an annular shape, a dipole shape and a quadrupole shape.

14. The method of claim 1, further comprising changing an intensity of a first portion of the radiation beam in a plane generally transverse to the radiation path relative to a second portion of the radiation beam in the same plane.

15. The method of claim 1 wherein changing the shape of the radiation beam from a first shape to a second shape includes changing the shape of the radiation beam to a second shape having a major axis and a minor axis, and wherein the method further comprises:
directing the radiation beam with the second shape along the radiation path toward an aperture of a reticle, the aperture having a major axis and a minor axis; and
aligning the major axis of the second shape of the radiation beam to be at least approximately parallel with the major axis of the aperture.

16. The method of claim 1, further comprising directing the beam through apertures of a reticle before impinging the beam on the microlithographic substrate.

17. The method of claim 1, further comprising directing the beam through apertures of a reticle after changing the shape of the radiation beam.

18. The method of claim 1 wherein changing the shape of the radiation beam from a first shape to a second shape includes changing from a first shape having a cross-sectional area with a first diameter to a second shape having a cross-sectional area with a second diameter different than the first diameter.

19. The method of claim 1, further comprising:
directing the radiation beam through a diffuser and toward a collecting lens;
passing the radiation beam through the collecting lens to incline at least part of the radiation beam relative to the radiation path; and
directing the radiation beam to impinge on the microlithographic substrate, with at least part of the radiation beam inclined relative to the radiation path.

20. A method for irradiating a radiation-sensitive material of a microlithographic substrate, comprising:
directing a beam of radiation along a radiation path toward a reflective surface, the beam of radiation having a first shape and a first intensity uniformity in a plane generally transverse to the first direction, the beam of radiation further having a first intensity;
changing a shape of the radiation beam from the first shape to a second shape different than the first shape by inclining a first portion of the reflective surface relative to a second portion of the reflective surface and reflecting the beam from the reflective surface toward a microlithographic substrate, the beam with the second shape having a second intensity uniformity less than the first intensity uniformity;
directing the radiation beam away from the reflective surface with a second intensity at least approximately the same as the first intensity;
changing an angle of at least a portion of the radiation beam relative to the radiation path by impinging the radiation beam on a reflective or refractive optical element after changing the shape of the beam from the first shape to the second shape;
impinging the beam on a reticle; and
impinging the beam on the radiation sensitive material of the microlithographic substrate after changing the shape from the first shape to the second shape and after impinging the beam on the reticle.

21. The method of claim 20, further comprising:
changing an angle of a first portion of the radiation beam relative to the radiation path from a first value to a second value;
changing an angle of a second portion of the radiation beam relative to the radiation path from the first value to a third value different than the second value; and
impinging the radiation beam on the microlithographic substrate with the first portion having a first intensity and the second portion having a second intensity different than the first intensity.

22. The method of claim 20, further comprising scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

23. The method of claim 20 further comprising stepping the microlithographic substrate and the reticle relative to each other by impinging the radiation on a first field of the microlithographic substrate while the microlithographic substrate is in a fixed transverse alignment with the reticle, moving at least one of the reticle and the microlithographic substrate transversely relative to the other to align a second field with the reticle, and exposing the second field to the radiation.

24. The method of claim 20, further comprising exposing a layer of photoresist material on the microlithographic substrate to the radiation beam.

25. The method of claim 20, further comprising:
   directing the radiation with the second shape along the radiation path and toward the microlithographic substrate;
   ceasing to impinge the radiation on the microlithographic substrate while changing a position of the first portion of the reflective surface relative to the second portion; and
   directing from the reflective surface and toward the microlithographic substrate radiation with a third shape different than the second shape.

26. The method of claim 20, further comprising changing the shape of the radiation beam from the second shape to a third shape different than the second shape while the radiation beam impinges on the microlithographic substrate by moving at least one of the first and second portions of the reflective surface relative to the other.

27. The method of claim 20 wherein changing a shape of the radiation beam from a first shape to a second shape different than the first shape includes changing the shape to at least one of an annular shape, a dipole shape and a quadrupole shape.

28. The method of claim 20, further comprising changing an intensity of a first portion of the radiation beam in a plane generally transverse to the radiation path relative to a second portion of the radiation beam in the same plane.

29. The method of claim 20 wherein changing the shape of the radiation beam from a first shape to a second shape includes changing the shape of the radiation beam to a second shape having a major axis and a minor axis, and wherein the method further comprises:
   directing the radiation beam with the second shape along the radiation path through the aperture of the reticle, the aperture having a major axis and a minor axis; and
   aligning the major axis of the second shape of the radiation beam to be at least approximately parallel with the major axis of the aperture.

30. A method for irradiating a radiation-sensitive material of the microlithographic substrate, comprising:
   directing a beam of radiation having a first intensity uniformity toward a reticle positioned to pass zeroth diffraction order radiation in a first direction toward the microlithographic substrate, and pass first diffraction order radiation in a second direction toward the microlithographic substrate, the second direction being inclined at a diffraction angle relative to the first direction;
   directing at least a portion of the radiation impinging on the reticle away from the first direction and toward the second direction by impinging the radiation on a reflective surface, inclining a first portion of the reflective surface relative to a second portion of the reflective surface, and reflecting the beam from the reflective surface to an optical element and toward the reticle, with the beam having a second intensity uniformity less than the first intensity uniformity;
   impinging the beam on the reticle; and
   directing the beam from the reticle to the radiation sensitive material of the microlithographic substrate after impinging the beam on the reticle.

31. The method of claim 30 wherein reflecting the beam to an optical element includes reflecting the beam through a converging lens, and wherein impinging the beam on the reticle includes passing the beam through an aperture in the reticle.

32. The method of claim 30, further comprising scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

33. The method of claim 30 further comprising stepping the microlithographic substrate and the reticle relative to each other by impinging the radiation on a first field of the microlithographic substrate while the microlithographic substrate is in a fixed transverse alignment with the reticle, moving at least one of the reticle and the microlithographic substrate transversely relative to the other to align a second field with the reticle, and exposing the second field to the radiation.

34. The method of claim 30, further comprising exposing a layer of photoresist material on the microlithographic substrate to the radiation beam.

35. The method of claim 30, further comprising:
   directing the radiation with the second shape along the radiation path toward the microlithographic substrate;
   ceasing to impinge the radiation on the microlithographic substrate while changing a position of the first portion of the reflective surface relative to the second portion; and
   directing from the reflective surface and toward the microlithographic substrate radiation with a third shape different than the second shape.

36. The method of claim 30, further comprising changing from the second shape to a third shape different than the second shape while the radiation beam impinges on the microlithographic substrate by moving at least one of the first and second portions of the reflective surface relative to the other.

37. The method of claim 30 wherein changing a shape of the radiation beam from a first shape to a second shape different than the first shape includes changing the shape to at least one of an annular shape, a dipole shape and a quadrupole shape.

38. The method of claim 30, further comprising changing an intensity of a first portion of the radiation beam in a plane generally transverse to the radiation path relative to a second portion of the radiation beam in the same plane.

39. The method of claim 30 wherein changing the shape of the radiation beam from a first shape to a second shape includes changing the shape of the radiation beam to a second shape having a major axis and a minor axis, and wherein the method further comprises:
   directing the radiation beam with the second shape along the radiation path toward an aperture of a reticle, the aperture having a major axis and a minor axis; and
   aligning the major axis of the second shape of the radiation beam to be at least approximately parallel with the major axis of the aperture.

40. A method for irradiating a microlithographic substrate, comprising:
   positioning a first microlithographic substrate on a support member;
   directing a radiation beam along a radiation path toward the first microlithographic substrate, the radiation beam having a first shape in a plane generally transverse to the radiation path;

moving a first portion of a reflective surface relative to a second portion of the reflective surface to define a first configuration of the reflective surface, correlating the first configuration with a first pattern of optical features of a first reticle;

changing a shape of the radiation beam from the first shape to a second shape different than the first shape by reflecting the radiation beam from the reflective surface while the reflective surface is in the first configuration;

directing the radiation beam with the second shape to an optical element, to the first reticle and to the first microlithographic substrate;

replacing the first reticle with a second reticle having a second pattern of optical features;

accommodating differences between the first reticle and the second reticle by moving the first portion of the reflective surface relative to the second portion to place the reflective surface in a second configuration different than the first configuration;

correlating the second configuration with the second pattern of optical features of the second reticle;

changing a shape of the radiation beam to a third shape different than the second shape by reflecting the radiation beam from the reflective surface while the reflective surface is in the second configuration; and directing the radiation beam with the third shape to the optical element, to the second reticle and to the second microlithographic substrate.

41. The method of claim 40, further comprising scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

42. The method of claim 40, further comprising stepping the microlithographic substrate and the reticle relative to each other by impinging the radiation on a first field of the microlithographic substrate while the microlithographic substrate is in a fixed transverse alignment with the reticle, moving at least one of the reticle and the microlithographic substrate transversely relative to the other to align a second field with the reticle, and exposing the second field to the radiation.

43. The method of claim 40, further comprising exposing a layer of photoresist material on the microlithographic substrate to the radiation beam.

44. The method of claim 40 wherein changing a shape of the radiation beam from a first shape to a second shape different than the first shape includes changing the shape to at least one of an annular shape, a dipole shape and a quadrupole shape.

45. The method of claim 40, further comprising changing an intensity of a first portion of the radiation beam in a plane generally transverse to the radiation path relative to a second portion of the radiation beam in the same plane.

46. The method of claim 40 wherein changing the shape of the radiation beam from a first shape to a second shape includes changing the shape of the radiation beam to a second shape having a major axis and a minor axis, and wherein the method further comprises:

directing the radiation beam with the second shape along the radiation path and through an aperture of the first reticle, the aperture having a major axis and a minor axis; and aligning the major axis of the second shape of the radiation beam to be at least approximately parallel with the major axis of the aperture.

47. A method for adjusting an intensity distribution of radiation directed to a radiation-sensitive material of a microlithographic substrate, comprising:

selecting a target distribution of radiation angles relative to a reticle plane of a reticle;

directing a radiation beam along a radiation path;

reflecting the radiation beam from a reflective surface, to an optical element and toward a reticle, the radiation beam having a first intensity uniformity and a first distribution of radiation angles relative to the reticle;

determining an error between the first distribution and the target distribution; and until the first distribution is at least approximately the same as the target distribution, changing the first distribution by inclining a first portion of the reflective surface relative to a second portion of the reflective surface to change a shape of the radiation beam in a plane generally transverse to the radiation path, and reflecting the radiation to the optical element toward the reticle, with the beam having a second intensity uniformity less than the first intensity uniformity.

48. The method of claim 47 wherein reflecting the radiation beam to an optical element involves passing the radiation beam through a converging lens.

49. The method of claim 47, further comprising scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

50. The method of claim 47, further comprising stepping the microlithographic substrate and the reticle relative to each other by impinging the radiation on a first field of the microlithographic substrate while the microlithographic substrate is in a fixed transverse alignment with the reticle, moving at least one of the reticle and the microlithographic substrate transversely relative to the other to align a second field with the reticle, and exposing the second field to the radiation.

51. The method of claim 47, further comprising exposing a layer of photoresist material on the microlithographic substrate to the radiation beam.

52. The method of claim 47, further comprising:

directing the radiation with the second shape along the radiation path toward the microlithographic substrate;

ceasing to impinge the radiation on the microlithographic substrate while changing a position of the first portion of the reflective surface relative to the second portion; and directing from the reflective surface and toward the microlithographic substrate radiation with a third shape different than the second shape.

53. The method of claim 47, further comprising changing the shape of the radiation beam from the second shape to a third shape different than the second shape while the radiation beam impinges on the microlithographic substrate by moving at least one of the first and second portions of the reflective surface relative to the other.

54. The method of claim 47 wherein changing a shape of the radiation beam from a first shape to a second shape different than the first shape includes changing the shape to at least one of an annular shape, a dipole shape and a quadrupole shape.

55. The method of claim 47, further comprising changing an intensity of a first portion of the radiation beam in a plane generally transverse to the radiation path relative to a second portion of the radiation beam in the same plane.

56. The method of claim 47 wherein changing the shape of the radiation beam from a first shape to a second shape includes changing the shape of the radiation beam to a second shape having a major axis and a minor axis, and wherein the method further comprises:

directing the radiation beam with the second shape through an aperture of a reticle, the aperture having a major axis and a minor axis; and aligning the major axis of the second shape of the radiation beam to be at least approximately parallel with the major axis of the aperture.

57. An apparatus for irradiating a radiation-sensitive material of a microlithographic substrate, comprising:

a support member configured to releasably support the microlithographic substrate;

a radiation source configured to emit a beam of radiation directed along a radiation path toward the support member;

a reticle positioned along the radiation path, the reticle being configured to pass the radiation toward the substrate support;

a reflective surface positioned along the radiation path, the reflective surface having a first portion and a second portion with the first portion movable relative to the second portion to change a shape of the radiation beam in a plane generally transverse to the radiation path from a first shape and a first intensity uniformity to a second shape different than the first shape wherein the beam with the second shape has a second intensity uniformity less than the first intensity uniformity;

an optical element positioned between the reflective surface and the support member to receive radiation from the reflective surface and direct at least some of the radiation at an angle relative to the radiation path; and a controller operatively coupled to the reflective surface, the controller being configured to direct the first portion of the reflective surface to move relative to the second portion to change the shape of the radiation beam from the first shape to the second shape.

58. The apparatus of claim 57 wherein the first portion of the reflective surface forms a smooth, continuous surface with the second portion of the reflective surface.

59. The apparatus of claim 57 wherein the first portion of the reflective surface includes a first reflective element and the second portion of the reflective surface includes a second reflective element movable independently from the first reflective element.

60. The apparatus of claim 57 wherein the reticle is coupled to a reticle actuator to move along a reticle path generally normal to the radiation path proximate to the reticle, and wherein the support member is coupled to a support member actuator to move along a support member path in a direction opposite the reticle and generally normal to the radiation path.

61. The apparatus of claim 57 wherein at least one of the support member and the reticle is coupled to at least one actuator to sequentially align fields of the microlithographic substrate with the radiation beam when the microlithographic substrate is carried by the support member.

62. The apparatus of claim 57 wherein the reticle has at least one reticle aperture positioned to pass the radiation beam toward the microlithographic substrate, and wherein the optical element includes a converging lens configured to direct at least part of the radiation beam at an angle relative to the radiation path.

63. An apparatus for irradiating a radiation-sensitive surface of a microlithographic substrate, comprising:

a support member configured to releasably support the microlithographic substrate;

a radiation source configured to emit a beam of radiation along a radiation path directed toward the support member;

a reticle positioned along the radiation path between the radiation source and the support member, the reticle being positioned to pass the radiation toward the substrate support;

a reflective surface positioned along the radiation path between the reticle and the radiation source, the reflective surface having a first portion and a second portion with the first portion movable relative to the second portion to change a shape of the radiation beam in a plane generally transverse to the radiation path from a first shape and a first intensity uniformity to a second shape different than the first shape wherein the beam with the second shape has a second intensity uniformity less than the first intensity uniformity;

an optical element positioned between the reflective surface and the support member to receive radiation from the reflective surface and direct at least some of the radiation at an angle relative to the radiation path; and a controller operatively coupled to the reflective surface, the controller being configured to direct the first portion of the reflective surface to move relative to the second portion to change the shape of the radiation beam from the first shape to the second shape.

64. The apparatus of claim 63 wherein the first portion of the reflective surface forms a smooth, continuous surface with the second portion of the reflective surface.

65. The apparatus of claim 63 wherein the first portion of the reflective surface includes a first reflective element and the second portion of the reflective surface includes a second reflective element movable independently from the first reflective element.

66. The apparatus of claim 63 wherein the reticle is coupled to a reticle actuator to move along a reticle path generally normal to the radiation path proximate to the reticle, and wherein the support member is coupled to a support member actuator to move along a support member path in a direction opposite the reticle and generally normal to the radiation path.

67. The apparatus of claim 63 wherein at least one of the support member and the reticle is coupled to at least one actuator to sequentially align fields of the microlithographic substrate with the radiation beam when the microlithographic substrate is carried by the support member.

68. The apparatus of claim 63 wherein the reticle has at least one reticle aperture positioned to pass the radiation beam toward the microlithographic substrate, and wherein the optical element includes a converging lens configured to direct at least part of the radiation beam at an angle relative to the radiation path.

69. The method of claim 1 wherein impinging the beam on the microlithographic substrate includes impinging the beam with a monotonically varying intensity distribution.

70. The method of claim 1 wherein impinging the beam on the microlithographic substrate includes impinging the beam with a non-monotonically varying intensity distribution.

71. The method of claim 1 wherein impinging the beam includes impinging a first beam region having a generally uniform intensity distribution spaced apart from a second beam region having a generally uniform intensity distribution.

\* \* \* \* \*